(12) United States Patent
Epke

(10) Patent No.: US 6,583,485 B2
(45) Date of Patent: Jun. 24, 2003

(54) SCHOTTKY DIODE

(75) Inventor: Thomas Epke, Osnabrück (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/819,281

(22) Filed: Mar. 28, 2001

(65) Prior Publication Data

US 2001/0042862 A1 Nov. 22, 2001

(30) Foreign Application Priority Data

Mar. 30, 2000 (DE) .......................... 100 15 884

(51) Int. Cl.[7] .............................. H01L 27/095
(52) U.S. Cl. ................ 257/484; 257/471; 257/481; 257/483
(58) Field of Search ................ 257/471, 476, 257/481, 483, 484; 438/570, 582

(56) References Cited

U.S. PATENT DOCUMENTS

| | | | | | |
|---|---|---|---|---|---|
| 4,110,775 A | * | 8/1978 | Festa | ........................ | 257/484 |
| 4,119,446 A | * | 10/1978 | Mastroianni | ................ | 438/526 |
| 4,607,270 A | * | 8/1986 | Iesaka | ........................ | 257/484 |
| 4,692,991 A | * | 9/1987 | Flowers | ...................... | 438/571 |
| 4,742,377 A | * | 5/1988 | Einthoven | .................. | 257/484 |
| 4,862,229 A | * | 8/1989 | Mundy et al. | ............... | 257/484 |
| 4,998,148 A | * | 3/1991 | Essaff | ........................ | 257/547 |
| 5,017,976 A | * | 5/1991 | Sugita | ........................ | 257/494 |

FOREIGN PATENT DOCUMENTS

| | | | | |
|---|---|---|---|---|
| DE | 19705728 A | | 8/1998 | |
| JP | 3-62-33456 | * | 2/1987 | .................. 257/471 |
| JP | 3-63-221668 | * | 2/1988 | .................. 257/483 |
| JP | 4-01-305564 | * | 12/1989 | .................. 257/481 |
| JP | 4-03-24767 | * | 2/1991 | .................. 257/475 |
| JP | 4-03-95930 | * | 4/1991 | ........ 438/FOR 335 |
| JP | 4-4-162682 | * | 6/1992 | .................. 257/471 |
| JP | 4-4-291966 | * | 10/1992 | .................. 257/461 |
| JP | 4-6-163878 | * | 6/1994 | .................. 257/481 |

* cited by examiner

Primary Examiner—George Eckert
(74) Attorney, Agent, or Firm—Steven R. Biren

(57) ABSTRACT

The invention relates to a semiconductor device, in particular a Schottky hybrid diode with a guard ring (S). The semiconductor device comprises a semiconductor substrate (1), an epitaxial layer (2) on which an insulating layer (3) with an opening (10) is deposited, with a Schottky metal layer (9) covering the epitaxial layer (2) lying at the bottom of the opening (10), and with an annular semiconductor region (4) which is present in the epitaxial layer (2). A doping region (6) is present in the epitaxial layer (2) along the outer contour of the semiconductor device, and in addition an oxide layer (8) is present on the epitaxial layer (2).

10 Claims, 4 Drawing Sheets

SCHOTTKY DIODE

FIELD OF THE INVENTION

The invention relates to a semiconductor device provided with a semiconductor substrate with a dopant of a first doping type with a doping concentration n1 on which an epitaxial layer with a dopant of a first doping type with a doping concentration n2 is provided, whereon an insulator layer with an opening is deposited, with a Schottky metal layer covering the epitaxial layer lying below said opening, with an annular semiconductor region lying in the epitaxial layer and comprising a dopant of a second doping type with a doping concentration n3 which adjoins the insulating layer and the Schottky metal layer in a region surrounding the metal-insulator transition, and to a method of manufacturing such a semiconductor device.

BACKGROUND OF THE INVENTION

Schottky diodes are semiconductor devices which have a metal-semiconductor transition as their basic structure and whose basic electronic properties are defined by this transition. A Schottky diode is formed from a semiconductor-metal combination which is chosen such that a depletion zone arises at the boundary surface. The current-voltage characteristic of this arrangement depends on the polarity of the applied voltage.

Although the operating principle of the metal-semiconductor transition in a Schottky diode differs essentially from that of a pn junction, the characteristic curves of a pn diode and a Schottky diode are similar. Compared with a pn diode, a Schottky diode has a lower threshold voltage and a substantially smaller, but strongly temperature-dependent saturation current. In addition, a Schottky diode has a barrier layer capacitance and no diffusion capacitance, which results in shorter switching times. Furthermore, the breakdown characteristic in the blocked state is partly very marked, so that the achievable breakdown voltages are considerably lower than in the case of pn diodes.

To improve and indeed achieve a defined breakdown behavior of a Schottky diode, DE 197 05 728 A1 describes a guard ring of a second doping tape which is diffused into the epitaxial layer of a first doping type. This guard ring achieves that the reverse bias voltage, which is low in the case of a normal Schottky diode, is substantially increased in comparison therewith. This effect is achieved in that the gradient of the field lines of the edge field of the metal electrode, i.e. the Schottky metal layer, is linearized through the fact that it ends at least partly in the ring-shaped semiconductor region of the second doping type.

The properties of a semiconductor device laid down in a specification are determined by the materials used, the design of the semiconductor device, and the doping profiles.

After a semiconductor device has been manufactured, a wide variety of, for example, growing, implantation, and diffusion processes may be carried out. The design of a semiconductor device is defined by a set of masks which depends on the specification. Each additional manufacturing step or masking step, however, is very expensive because it increases the processing time of the wafers in manufacture and leads to a higher personnel and machine expenditure.

SUMMARY OF THE INVENTION

The invention has for its object to provide an improved semiconductor device which can be manufactured with simple processes and the lowest possible number of process steps.

This object is achieved by means of a semiconductor device provided with a semiconductor substrate with a dopant of a first doping type with a doping concentration n1 on which an epitaxial layer with a dopant of a first doping type with a doping concentration n2 is provided, whereon an insulator layer with an opening is deposited, with a Schottky metal layer covering the epitaxial layer lying below said opening, with an annular semiconductor region lying in the epitaxial layer and comprising a dopant of a second doping type with a doping concentration n3 which adjoins the insulating layer and the Schottky metal layer in a region surrounding the metal-insulator transition, with a doping region present in the epitaxial layer and comprising a dopant of a first doping type with a doping concentration n4 and the dopant of a second doping type with a doping concentration n3 along the outer contour of the semiconductor device, and with an oxide layer which is present on the epitaxial layer, which adjoins the insulating layer, and which extends along the outer contour of the semiconductor device.

Such a semiconductor device comprises not only a guard ring but also a doping region along the outer contour of the diode. This doping region, also referred to as channel, is advantageous in preventing so-called channel currents. These channel currents flow between the guard ring and the separation lane, when the semiconductor device is biased in reverse direction.

A further advantageous embodiment is formed by the oxide layer along the outer contour of the diode. The outer contour at the same time represents the separation lane which delimits the individual semiconductor devices on the wafer. The oxide layer in the separation lane prevents the crystal from showing excessive fractures at the edge and being damaged during sawing.

It is preferred that the doping concentrations n1 and n4 are higher than the doping concentration n2.

It is furthermore preferred that the doping concentration n4 is higher than the doping concentration n3.

A doping region, the channel, is obtained in the epitaxial layer which prevents a breakdown of the semiconductor device at low voltages already, thanks to the different doping concentrations.

It is preferred that the material for the semiconductor substrate and the epitaxial layer comprises silicon.

Silicon has higher admissible operational temperatures than other semiconductor materials such as, for example, germanium.

It is furthermore preferred that the dopant of the first doping type is chosen from the group comprising P, As, and Sb.

It is furthermore preferred that the dopant of the second doping type is chosen from the group comprising B, Al, and Ga.

The different doping profiles render possible the manufacture of a wide range of semiconductor devices with non-linear current-voltage characteristics.

It is advantageous when the insulating layer and the oxide layer comprise $SiO_2$.

$SiO_2$ has a high chemical resistance, a low thermal conductivity, and a high coefficient of thermal expansion.

It is preferred that the Schottky metal layer comprises a material chosen from the group Al, Mo, W, Pt, Pd, Ag, Au, Ti, Ni, NiFe, and combinations of these materials.

Mo, W, Pt, Pd, Ag, Au, Ni, and Ti are metals with a high work function which do not diffuse into the semiconductor material. Although aluminum is not a metal with a high work function, it does present advantages as a Schottky metal layer at high voltages.

It is preferred that a protective layer is provided on the insulating layer and the oxide layer.

The protective layer protects the subjacent layers against mechanical loads and corrosion by moisture.

It is particularly preferred that the semiconductor device is a Schottky diode.

The semiconductor device is a so-called Schottky hybrid diode, because it has a guard ring.

The invention further relates to a method of manufacturing a semiconductor device provided with a semiconductor substrate with a dopant of a first doping type with a doping concentration n1 on which an epitaxial layer with a dopant of a first doping type with a doping concentration n2 is provided, whereon an insulator layer with an opening is deposited, with a Schottky metal layer covering the epitaxial layer lying below said opening, with an annular semiconductor region lying in the epitaxial layer and comprising a dopant of a second doping type with a doping concentration n3 which adjoins the insulating layer and the Schottky metal layer in a region surrounding the metal-insulator transition, which method comprises at least the steps of:

generating an epitaxial layer with a dopant of a first doping type with a doping concentration n2 on a semiconductor substrate comprising a dopant of a first doping type with a doping concentration n1, depositing an insulating layer on the epitaxial layer, exposing an annular region and a region adapted to the outer contour of the semiconductor device in the insulating layer, implanting a dopant of a second doping type with a doping concentration n3 into the exposed regions of the epitaxial layer, diffusing the dopant of the second doping type into the epitaxial layer, depositing an oxide layer on the exposed regions of the epitaxial layer, implanting a dopant of a first doping type with a doping concentration n4 into the oxide layer, exposing an opening in the insulating layer, diffusing the dopant of a first doping type from the oxide layer into the epitaxial layer, depositing a Schottky metal layer, and separating along the outer contour of the semiconductor device.

The method has the advantage that no more than eleven process steps with a total of two masks are required for manufacturing this semiconductor device. The manufacturing cost can be kept low as a result of this.

It may be advantageous that a protective layer is deposited on the insulating layer and the oxide layer before the Schottky metal layer is deposited.

The invention will now be explained in more detail below with reference to four Figures and an embodiment, wherein

DETAILED DESCRIPTION OF THE INVENTION

Figure 1:
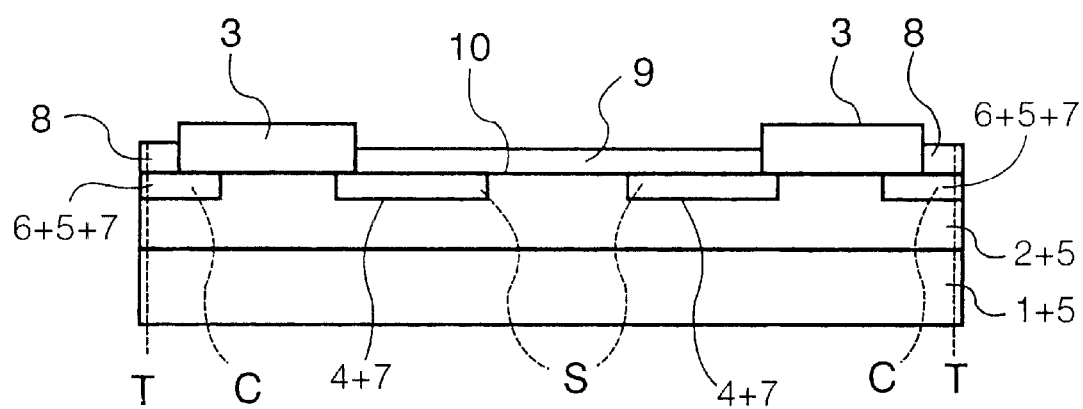
FIG. 1 shows a semiconductor device in cross-section.

In FIG. 1, a semiconductor device comprises a semiconductor substrate 1 with a dopant of a first doping type 5 with a first doping concentration n1 on which an epitaxial layer 2 with a dopant of a first doping type 5 with a second doping concentration n2 is provided. An insulating layer 3, for example comprising $SiO_2$ and having an opening 10, is deposited on the epitaxial layer 2. A Schottky metal layer 9 covers the epitaxial layer 2 which lies at the bottom of the opening 10. An annular semiconductor region 4, referred to as guard ring, with a dopant of a second doping type 7 is provided in the epitaxial layer 2 such that it adjoins the insulating layer 3 and the Schottky metal layer 9 in a region surrounding the metal-insulator transition. A doping region 6 with a dopant of a first doping type 5 and a dopant of a second doping type 7 is provided in the epitaxial layer 2 along the outer contour of the semiconductor device. An oxide layer 8 adjoining the insulating layer 3 is provided on the epitaxial layer 2 along the outer contour of the semiconductor device. In the arrangement described above, the semiconductor substrate 1 and the epitaxial layer 2 may comprise, for example, silicon. The dopant of a first doping type 5 may be, for example, P, As, or Sb, and the dopant of a second doping type 7 may be, for example, B, Al, or Ga. The same dopant or different dopants of the same doping type 7 may be, for example, B, Al, or Ga. The same dopant or different dopants of the same doping type may be used in the semiconductor substrate 1 and in the epitaxial layer 2. The Schottky metal layer 9 may comprise, for example, Al, Mo, W, Pt, Pd, Ag, Au, Ti, Ni, NiFe, or combinations of these materials.

Alternatively, the Schottky metal layer 9 may also be provided such that it covers part of the insulating layer 3.

A protective layer, for example made of $Si_3N_4$, may be provided on the insulating layer 3 and the oxide layer 8.

The electrical contacting of the semiconductor device takes place at the Schottky metal layer 9 and at the rear side of the semiconductor substrate 1.

Figure 2A:
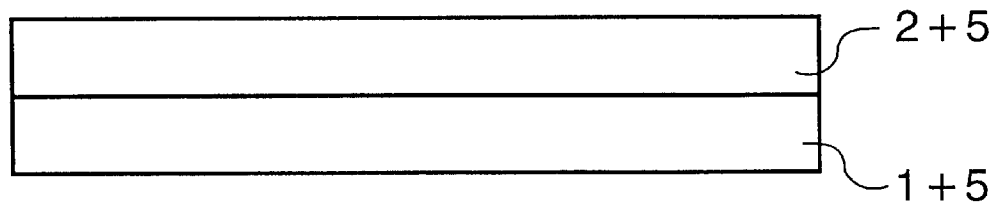
FIGS. 2 to 4 represent a flowchart of the manufacture of a semiconductor device.
Figure 2B:
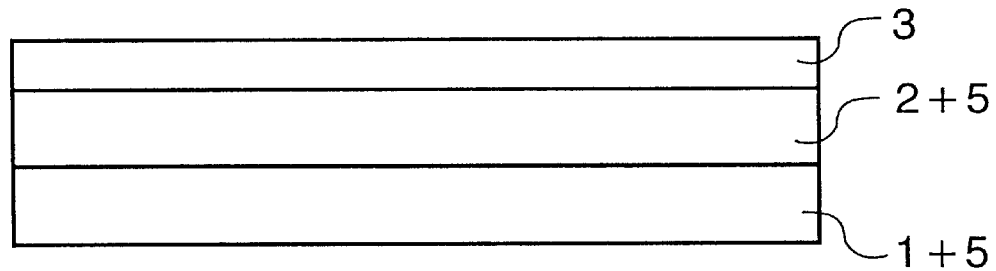
Figure 2C:
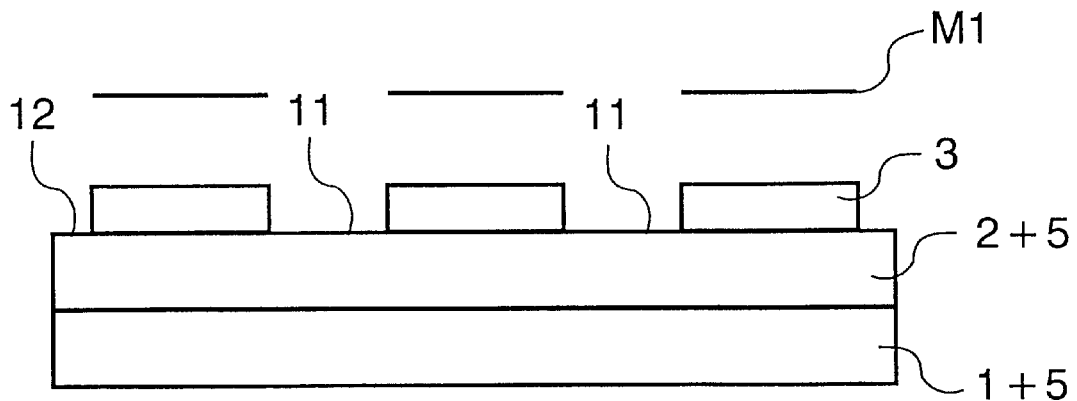

In the manufacture of a semiconductor device as shown in FIG. 2A, an epitaxial layer 2 is first created on a semiconductor substrate 1 which comprises, for example, silicon and a dopant of a first doping type 5 such as, for example, P, As, or Sb. The epitaxial layer 2 is made of the same material as the semiconductor substrate 1 and may also contain the same dopant. Alternatively, the two layers may have different dopants of the first doping type. The doping concentration n1 of the dopant of a first coping type 5 in the semiconductor substrate 1 is higher than the doping concentration n2 of the dopant of a first doping type 5 in the epitaxial layer 2. Subsequently, an insulating layer 3, for example made of $SiO_2$, is deposited (FIG. 2B). After a mask M1 has been applied, an annular region 11 and a region 12 adapted to the outer contour of the semiconductor device are exposed in the insulating layer 3 (FIG. 2C). After this process step, the outer boundaries of the semiconductor device, the separating lane and the channel, as well as the active region of the semiconductor device and the guard ring have been defined. The exposure step may be performed, for example, in a sputtering process, plasma etching, physical-chemical dry etching, or a chemical etch solution.

Figure 3A:
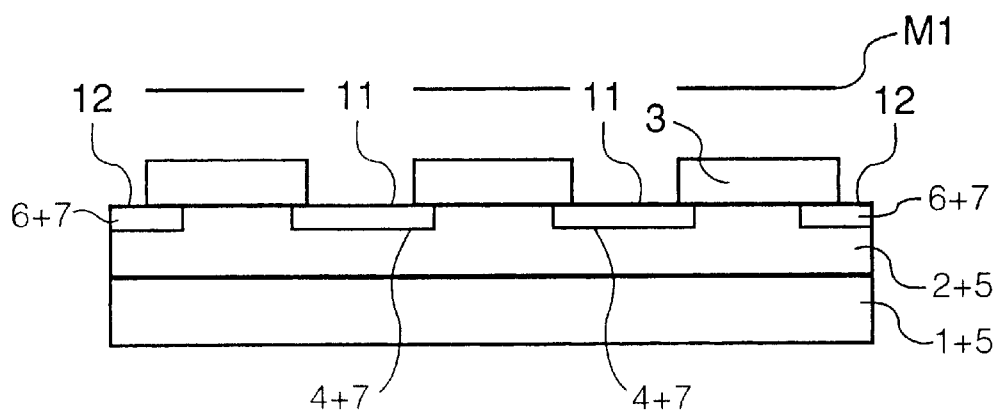
Figure 3B:
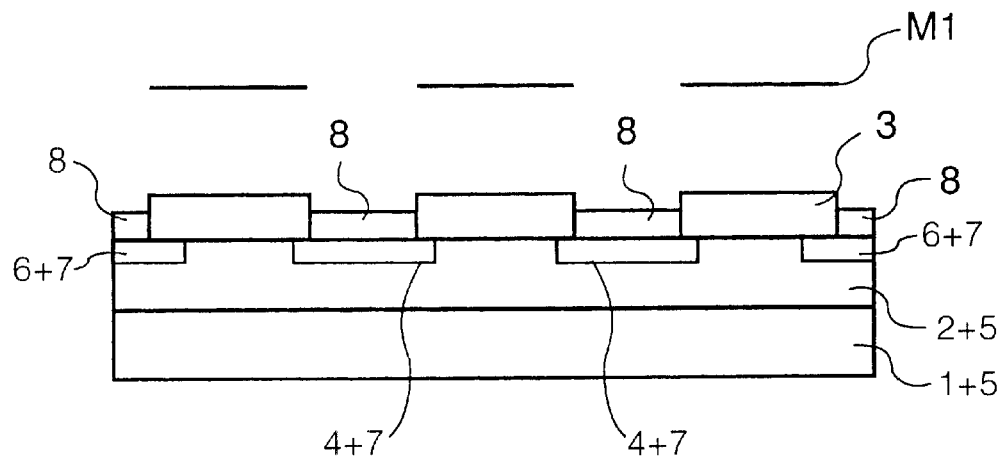
Figure 3C:
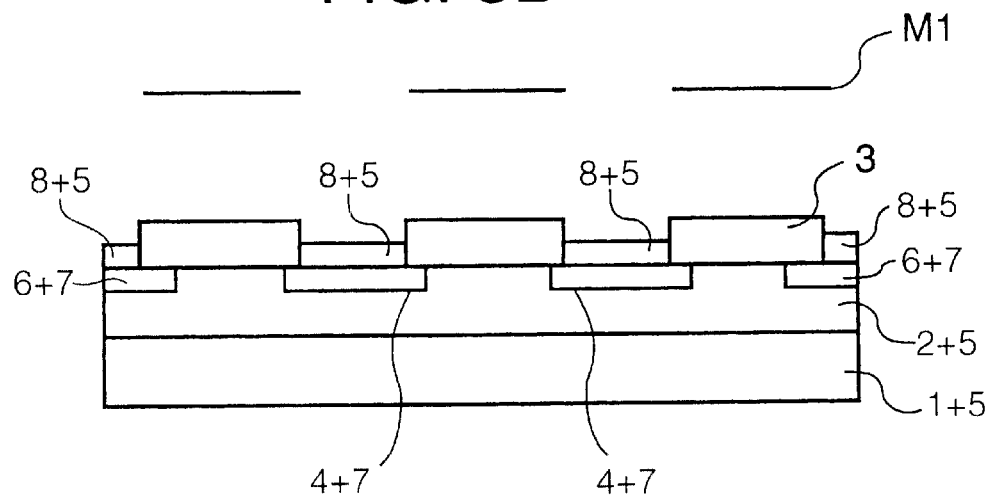

In the next step, a dopant of a second doping type 7 with a doping concentration n3 is implanted into the exposed regions 11, 12 of the epitaxial layer 2 and is diffused therein (FIG. 3A). The dopant of a second doping type 7 may comprise, for example, B, Al, or Ga. Subsequently, a thin oxide layer 8, for example comprising $SiO_2$, is deposited on the exposed regions 11, 12 of the epitaxial layer 2 (FIG. 3B). In FIG. 3C, a dopant of a first doping type 5 with a doping concentration n4 is implanted into the oxide layer 8. The doping concentration n4 is higher than the doping concentration n3 of the dopant, of a second doping type 7. The dopant of a first doping type 5 with a doping concentration n4 is preferably the same dopant as the dopant of a first doping type 5 with a doping concentration n2 present in the epitaxial layer 2.

Figure 4A:
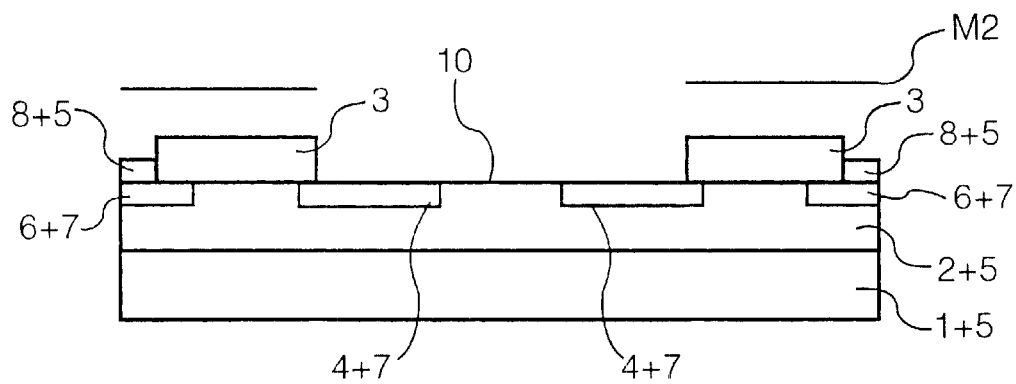
Figure 4B:
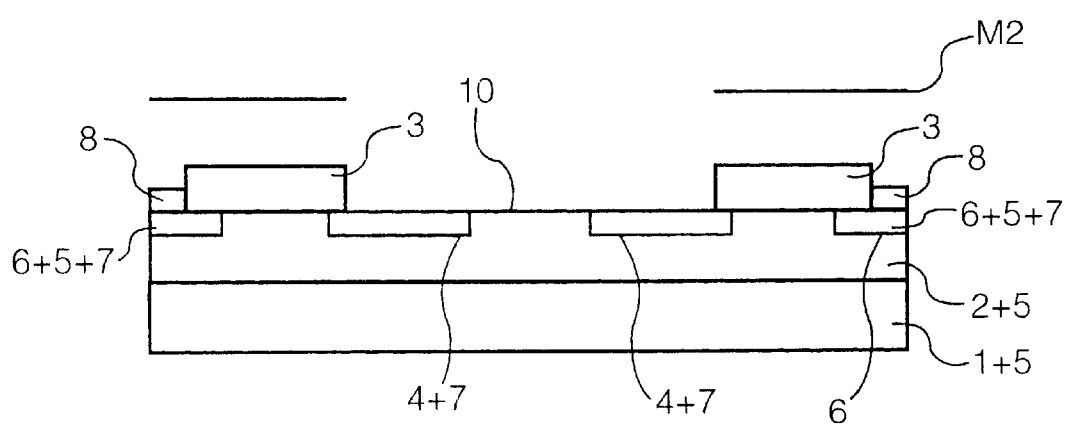
Figure 4C:
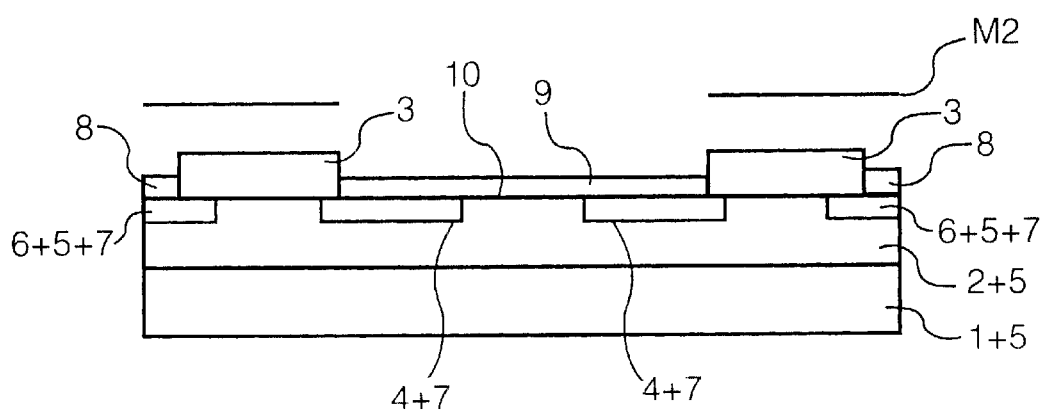

The insulating layer 3 and the oxide layer 8, which also contains the implanted dopant of a first doping type 5, are now removed, for example by means of etching, with the aid of a second mask M2 so as to create an opening 10 in the active surface of the semiconductor device (FIG. 4A). The dopant of a first doping type 5 in the remaining regions of the oxide layer 8 is diffused into the epitaxial layer 2 (FIG. 4B). This creates a doping region 6 with the dopant of a first doping type 5 and with the dopant of a second doping type 7 along the outer contour of the semiconductor device, a so-called channel. Then a Schottky metal layer 9 is deposited (FIG. 4C). The material for the Schottky metal layer 9 is, for example, Al, Mo, W, Pt, Pd, Ag, Au, Ti and Ni, NiFe, or combinations of these materials. The individual semiconductor devices are subsequently separated. This may be achieved, for example, by means of sawing.

A semiconductor device with a separating lane (T), a channel (C), and a guard ring (S) is thus obtained. The resulting semiconductor device may be, for example, a Schottky hybrid diode.

Alternatively, a protective layer, for example made of $Si_3N_4$, may be provided on the insulating layer 3 and on the oxide layer 8 by means of a third mask before the Schottky metal layer 9 is deposited.

Two embodiments of the invention will be explained in more detail below, representing examples of how the invention may be implemented in practice.

Embodiment 1

A semiconductor device with a guard ring (S), a separating lane (T), and a channel (C) comprises a semiconductor substrate 1 and an epitaxial layer 2 of silicon, each containing phosphorus as the dopant of a first doping type 5. The doping concentration n2 in the epitaxial layer 2 is lower than the doping concentration n1 in the semiconductor substrate 1. An insulating layer 3 of $SiO_2$ with an opening 10 is deposited on the epitaxial layer 2. A Schottky metal layer 9 of Al covers the epitaxial layer 2 which lies at the bottom of the opening 10. An annular semiconductor region 4 with gallium as its dopant of a second doping type 7 with a doping concentration n3 is provided in the epitaxial layer 2. A doping region 6 with the dopant of a first doping type 5, phosphorus, and the dopant of a second doping type 7, gallium, is provided in the epitaxial layer 2 along the outer contour of the semiconductor device, which region forms the channel of the semiconductor device. The doping concentration n4 of the phosphorus is higher than the doping concentration n2 and higher than the doping concentration n3 of the gallium. An oxide layer 8 of $SiO_2$ is provided on the epitaxial layer 2, i.e. on the doping region 6 along the outer contour of the semiconductor device.

Embodiment 2

To manufacture a Schottky hybrid diode, an epitaxial layer 2 of silicon with phosphorus as the dopant of a first doping type 5 was created on a semiconductor substrate 1 of silicon with antimony as its dopant of a first doping type 5. The doping concentration n2 of the phosphorus in the epitaxial layer 2 was lower than the doping concentration n1 of the antimony in the semiconductor substrate 1. In the next step, an insulating layer 3 of $SiO_2$ was deposited, which layer was structured by means of plasma etching and a first mask M1 such that an annular region 11 and a region 12 of the epitaxial layer 2 adapted to the outer contour of the diode were exposed. Boron with a doping concentration n3 was implanted and diffused into the epitaxial layer 2 so as to form the dopant of a second doping type 7. Subsequently, a thin oxide layer 8 of $SiO_2$ was deposited on the exposed regions 11, 12 of the epitaxial layer 2. Phosphorus with a doping concentration n4 higher than the doping concentrations n2 and n3 was implanted into this oxide layer 8 so as to form the dopant of a first doping type 5. The insulating layer 3 and the oxide layer 8 were removed from the active region of the diode by means of plasma etching and a second mask M2, so that an opening 10 was created. Then the phosphorus was diffused from the remaining oxide layer 8 into the epitaxial layer 2, so that a doping region 6 with boron and phosphorus was created along the outer contour of the diode. In the next step, a Schottky metal layer 9 of aluminum was deposited. Then the individual diodes were separated by means of sawing.

What is claimed is:

1. A semiconductor device provided with a semiconductor substrate (1) with a dopant of a first doping type (5) with a doping concentration n1 on which an epitaxial layer (2) with a dopant of a first doping type (5) with a doping concentration n2 is provided, whereon an insulating layer (3) with an opening (10) is deposited, with a Schottky metal layer (9) covering the epitaxial layer (2) lying below said opening (10), with an annular semiconductor region (4) lying in the epitaxial layer (2) and comprising a dopant of a second doping type (7) with a doping concentration n3 which adjoins the insulating layer (3) and the Schottky metal layer (9) in a region surrounding the metal-insulator transition, with a doping region (6) present in the epitaxial layer (2) and comprising a dopant of a first doping type (5) with a doping concentration n4 and the dopant of a second doping type (7) with a doping concentration n3 along the outer contour of the semiconductor device, and with an oxide layer (8) which is present on the epitaxial layer (2), which adjoins the insulating layer (3), and which extends along the outer contour of the semiconductor device.

2. A semiconductor device as claimed in claim 1, characterized in that the doping concentrations n1 and n4 are higher than the doping concentration n2.

3. A semiconductor device as claimed in claim 1, characterized in that the doping concentration n4 is higher than the doping concentration n3.

4. A semiconductor device as claimed in claim 1, characterized in that the material for the semiconductor substrate (1) and the epitaxial layer (2) comprises silicon.

5. A semiconductor device as claimed in claim 1, characterized in that the dopant of a first doping type (5) is chosen from the group comprising P, As, and Sb.

6. A semiconductor device as claimed in claim 1, characterized in that the dopant of a second doping type is chosen from the group comprising B, Al, and Ga.

7. A semiconductor device as claimed in claim 1, characterized in that the insulating layer (3) and the oxide layer (8) comprise $SiO_2$.

8. A semiconductor device as claimed in claim 1, characterized in that the Schottky metal layer (9) comprises a material chosen from the group Al, Mo, W, Pt, Pd, Ag, Au, Ti, Ni, NiFe, and combinations of these materials.

9. A semiconductor device as claimed in claim 1, characterized in that a protective layer is provided on the insulating layer (3) and the oxide layer (8).

10. A semiconductor device as claimed in claim 1, characterized in that the semiconductor device is a Schottky hybrid diode.

* * * * *